United States Patent [19]

Matsuo et al.

[11] Patent Number: 4,527,076
[45] Date of Patent: Jul. 2, 1985

[54] SIGNAL LEVEL COMPARING CIRCUIT

[75] Inventors: Kenji Matsuo; Minoru Takata, both of Yokohama, Japan

[73] Assignee: Tokyo Shibaura Denki Kabushiki Kaisha, Kawasaki, Japan

[21] Appl. No.: 440,732

[22] Filed: Nov. 10, 1982

[30] Foreign Application Priority Data

Nov. 16, 1981 [JP] Japan .................. 56-183273

[51] Int. Cl.³ .............. H03K 5/153; H03K 5/01; H03K 5/08
[52] U.S. Cl. .................. 307/362; 307/260; 307/264; 307/268; 307/279; 307/473; 307/490; 307/494; 307/570; 307/571
[58] Field of Search ............ 307/570, 571, 574, 575, 307/581, 279, 473, 475, 362, 260, 261, 263, 264, 268, 490, 494

[56] References Cited

U.S. PATENT DOCUMENTS 4,005,315  1/1977  Blauschild ............ 307/209
4,100,429  7/1978  Adachi ................ 307/205

FOREIGN PATENT DOCUMENTS 948285  5/1974  Canada ................ 307/362

OTHER PUBLICATIONS

G. B. Clayton, "Operational Amplifiers", pp. 145–147.

Primary Examiner—Stanley D. Miller
Assistant Examiner—Richard Roseen
Attorney, Agent, or Firm—Finnegan, Henderson, Farabow, Garrett & Dunner

[57] ABSTRACT

A signal level comparing circuit includes a comparator operated by a power source voltage and impressed with a reference voltage lower than the power source voltage at a non-inverted input terminal, first and second resistors connected at one end to the inverted input terminal of the comparator. The other end of the second resistor is grounded through an MOS transistor whose gate is connected to the output terminal of the comparator. The signal level comparing circuit further includes a resistor which is connected at one end to the inverted input terminal of the comparator and grounded through an MOS transistor whose gate is connected to the output terminal of the comparator through an inverter.

6 Claims, 11 Drawing Figures

F I G. 4
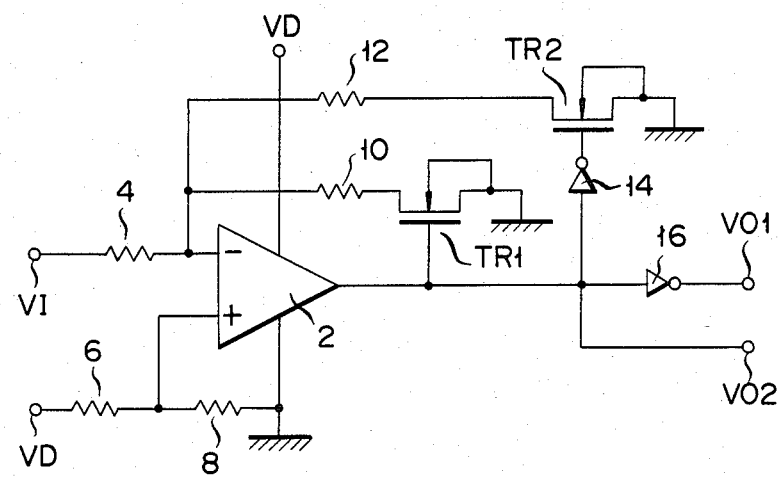
F I G. 5
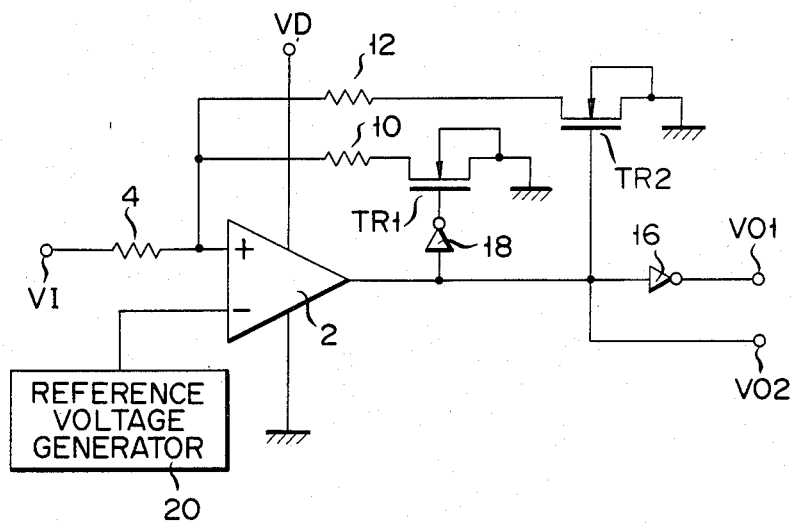

SIGNAL LEVEL COMPARING CIRCUIT

BACKGROUND OF THE INVENTION

This invention relates to a signal level-comparing circuit.

In general, in an LSI circuit formed of MOS transistors, the voltage level of an input signal to the LSI circuit is chosen to fall within the range defined by the power source voltage of the LSI circuit. Assuming that the power source voltage VDD has 5 volts, the voltage or dynamic range of an input signal to the above-mentioned LSI circuit is defined within the range of 0 to 5 volts. This means that when the voltage of an output signal from the LSI circuit is changed from a high level to a low level or vice versa, the level of the correspondingly input signal to the LSI circuit is supposed to be set between 0 and 5 volts. When the ordinary CMOS inverter is supplied with, for example, an input signal shown in FIG. 1A, then an output signal indicated in FIG. 1B is produced. When, in this case, the input signal reaches a prescribed level, the output signal is inverted. In a case where an ordinary Schmitt trigger circuit is supplied with an input signal shown in FIG. 2A, then an output signal indicated in FIG. 2B is obtained. When, in this case, the voltage level of an input signal becomes higher than a first prescribed voltage level, then the resultant output signal has its voltage changed from a lower to a high level. Conversely when an input signal has its voltage set at a second prescribed level lower than the first prescribed voltage level, then the output signal has its voltage shifted from a high to a low level.

No problems have been raised, so long as the CMOS inverter, Schmitt trigger, etc. are supplied, for example, with an input signal having a lower voltage than the power source voltage. However, as a microcomputer, for example, is applied in a progressively wider field, it is more strongly demanded to process an input signal whose maximum voltage stands higher than the voltage for operating an LSI device constituting the microcomputer. In other words, a strong demand is made to develop a circuit which, when an input signal has a voltage level lying between the voltages VSS and VDD shown in FIG. 3A, sends forth an output signal having a voltage level VDD indicated in FIG. 3B, and when an input signal has a voltage level higher than a prescribed level set between the power source voltage VDD and maximum voltage VHH, produces an output signal having a voltage level of VSS shown in FIG. 3B.

SUMMARY OF THE INVENTION

It is accordingly an object of this invention to provide a signal level comparing circuit which can process an input signal whose maximum voltage level stands higher than the voltage of an operation power source.

To attain the above-mentioned object, this invention provides a signal level comparing circuit which comprises first and second input terminals to be respectively set at first and second prescribed potentials; signal level comparing means actuated by a power source voltage impressed between the first and second input terminals, the first input terminal of the signal level comparing means being held at a reference potential lying between the first and second prescribed potentials; first to third resistive means which are connected to a second input terminal of the signal level comparing means at one end thereof; a signal input terminal connected to the other end of the first resistive means; and first and second switching means respectively connected to the other ends of the second and third resistive means.

BRIEF DESCRIPTION OF THE DRAWINGS

FIG. 4 shows the arrangement of a signal level comparing circuit according to a first embodiment of this invention;

FIG. 5 shows the arrangement of a signal level comparing circuit according to a second embodiment of the invention;

DETAILED DESCRIPTION OF THE PREFERRED EMBODIMENTS

Figure 1A:
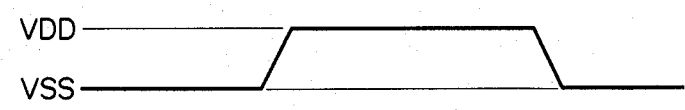
FIGS. 1A, 1B, 2A, 2B, 3A, and 3B indicate the waveforms of input and output signals by way of explaining the operation of various conventional signal level comparing circuits.
Figure 1B:
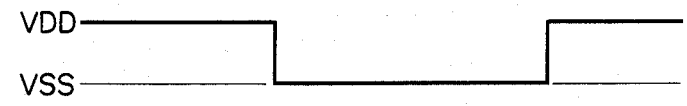
Figure 2A:
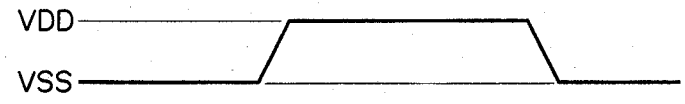
Figure 2B:
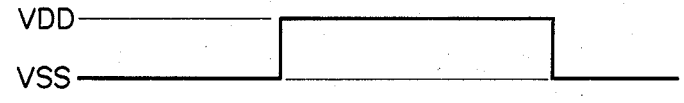
Figure 3A:
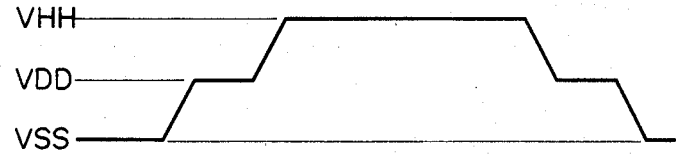
Figure 3B:
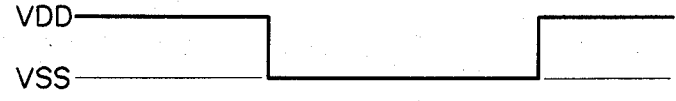

FIG. 4 is a circuit diagram of a signal level comparing circuit according to a first embodiment of this invention. This comparing circuit includes a comparator 2 actuated by a power source voltage impressed between a power supply terminal VD and the ground. The inverted input terminal of the comparator 2 is connected to a signal input terminal VI through a resistor 4. The noninverted input terminal of the comparator 2 is connected to a junction of resistors 6 and 8 connected in series between the power supply terminal VD and ground. Connected between the inverted input terminal of the comparator 2 and ground are a series circuit of a resistor 10 and n-channel MOS transistor TR1 and a series circuit of a resistor 12 and n-channel MOS transistor TR2. The gate of the MOS transistor TR1 is connected to the output terminal of the comparator 2. The gate of the MOS transistor TR2 is connected to the output terminal of the comparator 2 through an inverter 14. The output terminal of the comparator 2 is connected to a first signal output terminal VO1 through an inverter 16, and also to a second signal output terminal VO2.

A potential VR prevailing at the junction of the resistors 6 and 8 is expressed by the following equation (1):

$$VR = R8/(R6+R8) \cdot VDD \tag{1}$$

where:
R6 and R8 are resistances of the resistors 6 and 8.
VDD is a power source voltage impressed on the power supply terminal VD.

Now assume that an input voltage VIN impressed on the signal input terminal VI has a zero level 0 V. Then the comparator 2 generates an ouput voltage VOT having a high level or a level VDD, thereby rendering the MOS transistor TR1 conductive, and the MOS transistor TR2 nonconductive. When the input voltage VIN stands at the level VDD, then the input voltage VDN supplied to the inverted input terminal of the comparator 2 which is so constructed as to have the later described high input impedance is expressed by the following equation (2):

$$VDN = R10/(R4+R10) \cdot VDD \tag{2}$$

where:

R4 and R10 are resistances of the resistors 4 and 10.

If the resistances R4, R6, R8, R10 are so set as to indicate VDN<VR, then the ouput voltage VOT of the comparator 2 remains at the level VDD. Now, assume that the resistor R4 has a resistance of 200 kΩ, and the resistors R6, R8, R10 have a resistance of 100 kΩ alike. If, in this case, the input voltage VIN has a level VDD or 5 volts, then the potential VR prevailing at the junction of the resistors 6 and 8 has 2.5 volts, and the input voltage VDN supplied to the inverted input terminal of the comparator 2 has 1.67 volts. As a result, the output voltage VOT from the comparator 2 is held at a level VDD or 5 volts.

Now suppose that an input voltage VIN reaches a level VH1 higher than VDD, causing an output signal VOT from the comparator 2 to become low. In this case, an input voltage VHN1 supplied to the inverted input terminal of the comparator 2 is expressed as follows:

$$VHN1 = R10/(R4+R10) \cdot VH1 \quad (3)$$

If the above-mentioned input voltage VHN1 is set equal to an input voltage VR impressed on the noninverted input terminal of the comparator 2, the following equation can be derived from the aforesaid equations (1) and (3).

$$VH1 = R8/(R6+R8) \cdot VDD \times (R4+R10)/R10 = 7.5 \ (V) \quad (4)$$

When, in the above-mentioned case, the input voltage VIN has a level equal to or larger than 7.5 volts, then the comparator produces an output signal having a low voltage level or VSS level. Consequently the MOS transistor TR1 is rendered nonconductive and the MOS transistor TR2 is rendered conductive, causing the inverted input terminal of the comparator 2 to be impressed with an input voltage VHN2 expressed by the following equation:

$$VHN2 = R12/(R4+R12) \cdot VH1 \quad (5)$$

where:

R12 is a resistance of the resistor 12.

When R12 is chosen to be larger than R10, then there results VHN2>VHN1. Consequently, the voltage of an output signal from the comparator 2 is securely held at a level VSS. For instance, when R12 is chosen to be 150 kΩ, then the above-mentioned input voltage VHN2 indicates 3.2 volts. In other words, when the input signal VIN progressively increases in voltage to eventually reach a level VH1, then the MOS transistor TR1 is rendered nonconductive, and the MOS transistor TR2 is rendered conductive. As a result, the voltage impressed on the inverted input terminal of the comparator 2 suddenly rises from VHN1 (2.5 volts) to VHN2 (3.2 volts), causing the voltage of an output signal from the comparator 2 to be reliably set at a level VSS.

Now, assume that the voltage of an input signal VIN falls from the maximum level VHH (for example, 10 volts) to a level VH2 higher than the level VDD, causing an output signal VOT from the comparator 2 to become high. Then input voltage VHN3 impressed on the inverted input terminal of the comparator 2 is expressed as follows:

$$VHN3 = R12/R4+R12 \cdot VH2 \quad (6)$$

If above-mentioned input voltage VHN3 is set equal to an input voltage VR impressed on the noninverted input teminal of the comparator 2, then the following equation results from the equations (1) and (6):

$$VH2 = VR \times R4+R12/R12 = 5.8 \ (V) \quad (7)$$

When, in the aformentioned case, an input voltage VIN has a level equal to or lower than 5.8 volts, then the input voltage VHN3 gets lower than the input voltage VR. As a result, the comparator 2 generates an output signal having a high voltage level or VDD level, causing the MOS transistor TR1 to be rendered conductive and the MOS transistor TR2 to be rendered nonconductive. Consequently, the input voltage impressed on the inverted input terminal of the comparator 2 suddenly falls from the level VHN3 to the voltage level VHN4 expressed by the following equation:

$$VHN4 = R10/R4+R10 \cdot VH2 = 1.9 \ (V) \quad (8)$$

Thus, an output signal from the comparator 2 is reliably held at a voltage level VDD.

As described above, a signal level comparing circuit of FIG. 4 is so arranged as to produce an output signal having a voltage level VDD or VSS depending on the voltage level of an input signal whose maximum voltage VHH is higher than the drive voltage VDD of an LSI device. Therefore, the subject signal level comparing circuit enables the MOS LSI device to be applied in a broader field than has been possible in the past.

Description is now given with reference to FIG. 5 of a signal level comparing circuit according to a second embodiment of this invention. With the second embodiment, the gate of the MOS transistor TR1 is connected to the output terminal of the comparator 2 through an inverter 18. The gate of the MOS transistor TR2 is directly connected to the output terminal of the comparator 2. The input terminal VI of the signal level comparing circuit is connected to the noninverted input terminal of the comparator 2. The reference voltage generator 20 is connected to the inverted input terminal of the comparator 2. The second embodiment of FIG. 5 has substantially the same circuit pattern as that of FIG. 4 except for the above-mentioned arrangement. The reference voltage generator 20 may be formed of the resistors 6 and 8 shown in FIG. 4 and generates a reference voltage expressed by the equation (1).

When, with the signal level comparing circuit of FIG. 5 an input voltage VIN rises above a voltage level VH1; and an input voltage impressed on the noninverted input terminal of the comparator 2 becomes higher than the reference voltage VR, then an output signal having a high voltage level is produced from the comparator 2. As a result, the MOS transistor TR1 is rendered nonconductive, and the MOS transistor TR2 is rendered conductive. Since the resistor 12 has a higher resistance than the resistor 10 as previously described, an input voltage impressed on the noninverted terminal of the comparator 2 suddenly rises up to a prescribed level, causing an output signal from the comparator 2 to reliably stand at a voltage level VDD. When the input voltage VIN gradually falls from the maximum level VHH to a lower level than the voltage level VH2, then an input voltage impressed on the noninverted input terminal of the comparator 2 becomes lower than the reference voltage VR. As a result, an output signal having a low voltage level is produced from the comparator, causing the MOS transistor TR1 to be rendered conductive and the MOS transistor TR2 to be rendered nonconductive. Since the resistor 10 has a lower resistance than the resistor 12, an input voltage impressed on the noninverted input terminal of the comparator 2 rapidly drops to a prescribed level, causing an output signal from the comparator 2 to be reliably held at a low voltage level.

Like the first embodiment of FIG. 4, the second embodiment of FIG. 5 can produce an output signal whose voltage level varies with the level of an input voltage higher than the voltage level VDD.

Figure 6:
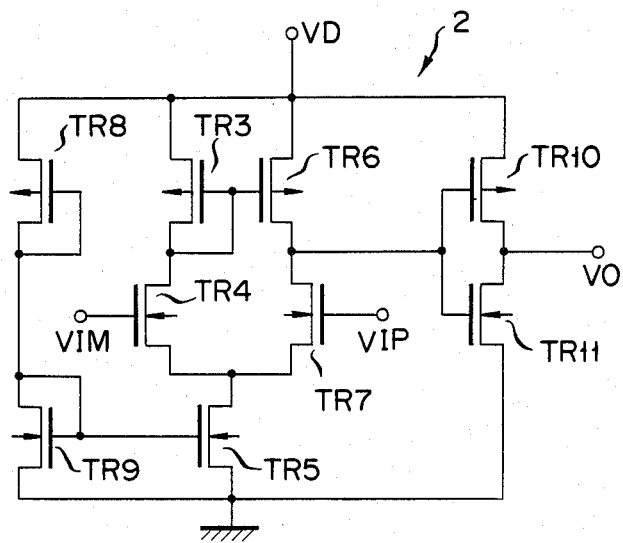
FIG. 6 is a circuit diagram of a comparator used with the signal level comparing circuits of FIGS. 4 and 5.

FIG. 6 shows the concrete arrangement of the comparator 2 used in the signal level comparing circuits indicated in FIGS. 4 and 5. The comparator 2 includes p-channel MOS transistor TR3, n-channel MOS transistor TR4 and n-channel MOS transistor TR5 whose current paths are connected in series between the power supply terminal VD and ground; a p-channel MOS transistor TR6 whose source is connected to the power supply terminal VD, and whose gate is connected to the gate and drain of the MOS transistor TR3; an n-channel MOS transistor TR7 whose current path is connected between the drain of the MOS transistor TR6 and the drain of the MOS transistor TR5; and p-channel and n-channel MOS transistors TR8 and TR9 whose current paths are connected in series between the power supply terminal and ground. The gate of the MOS transistor TR4 is connected to the inverted input terminal VIM of the comparator 2. The gate of the MOS transistor TR7 is connected to the noninverted terminal VIP of the comparator 2. The gate and drain of the MOS transistor TR8 are connected together. The gate and drain of the MOS transistor TR9 are connected to the gate of the MOS transistor TR5. The comparator 2 further includes a p-channel MOS transistor TR10 and an n-channel MOS transistor TR11 whose current paths are connected in series between the power supply terminal VD and ground, and whose gates are respectively connected to the drains of the MOS transistors TR6 and TR7. The drains of the MOS transistors TR10 and TR11 are connected to the output terminal VO of the comparator 2. The MOS transistor TR3 to TR7 jointly constitute a differential amplifier. The MOS transistors TR8, TR9 and TR5 jointly act as a constant current source for supplying a constant current to the differential amplifier. The MOS transistor TR10 and TR11 are jointly used as an inverter circuit for shaping the waveform of an output signal from the differential amplifier.

When the comparator of FIG. 6 is used in the signal level comparing circuit of FIG. 4, the input terminal VI is connected to the gate of the MOS transistor TR4, and the junction of the resistors 6 and 8 is connected to the gate of the MOS transistor TR7. When the gate voltage of the MOS transistor TR4 is lower than that of the MOS transistor TR7, then the MOS transistor TR7 is rendered conductive. At this time, the drain of the MOS transistor TR7 is impressed with a low voltage. As a result, the MOS transistor TR10 is rendered conductive, and the MOS transistor TR11 is rendered nonconductive, causing an output signal having a high voltage level to be generated from the output terminal VO. When the gate voltage of the MOS transistor TR4 becomes higher than the gate voltage of the MOS transistor TR7, then the MOS transistor TR7 is rendered nonconductive, causing the drain thereof to have a high voltage level. As a result, the MOS transistor TR11 is rendered conductive, and the MOS transistor TR10 is rendered nonconductive, causing an output signal having a low voltage level to be produced from the output terminal VO of the comparator 2.

Figure 7:
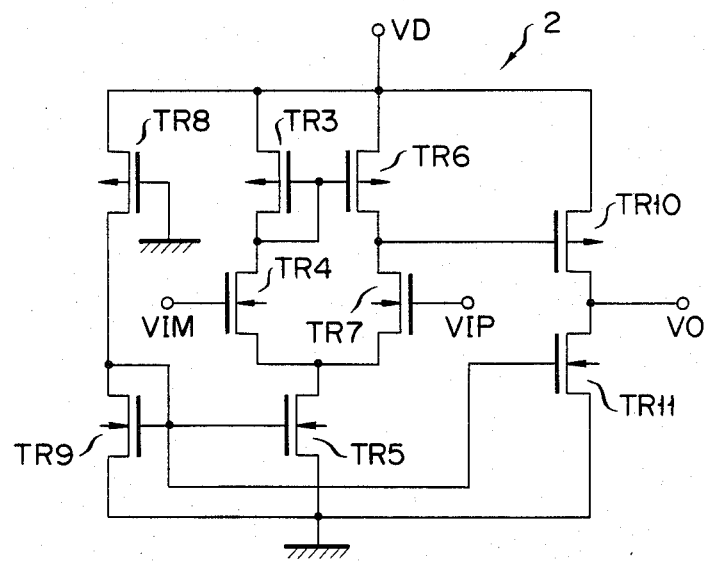
FIG. 7 shows a modification of the signal level comparing circuit of FIG. 6.

Description is now given with reference to FIG. 7 of a signal level comparing circuit modified from that of FIG. 6. The comparator of FIG. 7 has substantially the same arrangement as that of FIG. 6, except that the gate of the MOS transistor TR8 is grounded without being connected to the drain thereof; and the gate of the MOS transistor TR11 is connected to the gate and source of the MOS transistor TR9 instead of being connected to the drains of the MOS transistors TR6 and TR7. In principle, the comparator of FIG. 7 is operated in the same manner as the comparator of FIG. 6.

Figure 8:
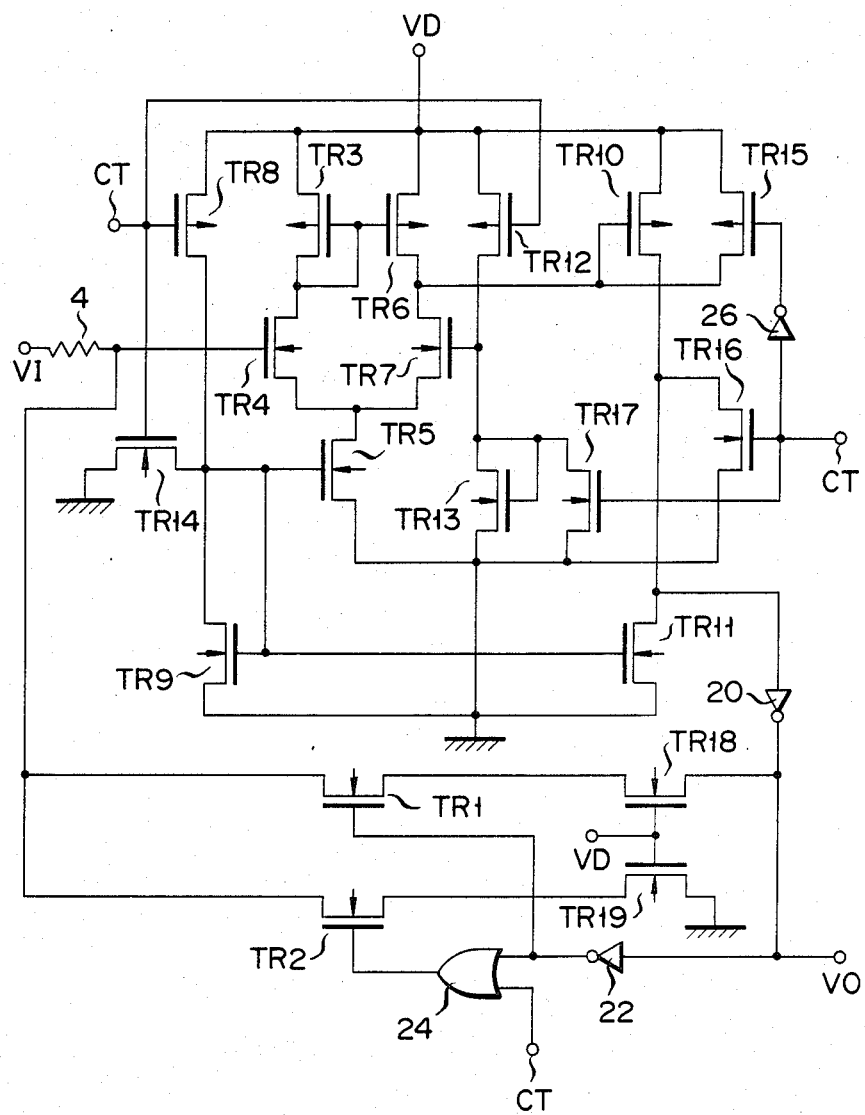
FIG. 8 is a circuit diagram of a signal level comparing circuit according to a third embodiment of the invention which employs the comparator of FIG. 7.

Description is now given with reference to FIG. 8 of a signal level comparing circuit according to a third embodiment of this invention. This signal level comparing circuit includes a p-channel MOS transistor TR12 and n-channel MOS transistor TR13 respectively corresponding to the resistors 6 and 8 of FIG. 4, and an n-channel MOS transistor TR14, p-channel MOS transistor TR15, n-channel MOS transistor TR16 and n-channel MOS transistor TR17. The junction of the MOS transistors TR10 and TR11 is connected to the output terminal VO of the signal level comparing circuit through an inverter 20. The output terminal of this inverter 20 is connected to the gate of the MOS transistor TR2 through another inverter 22, and further to one input terminal of a NOR gate 24, the other input terminal of which is connected to a control terminal CT. The output terminal of the NOR gate 24 is connected to the gate of the MOS transistor TR1. The current paths of the MOS transistors TR1 and TR2 are respectively connected in series with the current paths of n-channel MOS transistors TR18 and TR19 corresponding to the resistors 10 and 12 of FIG. 4. The gate of the MOS transistors TR12, TR14, TR16, TR17 and TR18 are connected to the control terminal CT. The gate of the MOS transistor TR15 is connected to the control terminal CT through an inverter 26.

When, in the signal level comparing circuit of FIG. 8, voltage having a low level is impressed on the control terminal CT, the MOS transistors TR14, TR15, TR16 and TR17 are rendered nonconductive, and the MOS transistors TR12 and TR14 are rendered conductive. Under this condition, the gate of the MOS transistor TR7 is impressed with the reference voltage VR, and the differential amplifier constituted by the MOS transistors TR3 to TR7 produces an output signal corresponding to an input signal to be supplied to the input terminal VI or the gate voltage of the MOS transistor TR4. An output circuit constituted by the MOS transistors TR10 and TR11 inverts an output signal from the differential amplifier. The inverted output signal is delivered to the output terminal VO of the signal level comparing circuit of FIG. 8. When the gate voltage of, for example, the MOS transistor TR4 has a low level, the drain voltage of the MOS transistor TR11 stands at a high level, causing the MOS transistor TR1 to be rendered conductive. When the gate voltage of the MOS transistor TR4 becomes higher, the MOS transistor TR2 is rendered conductive. When a low level voltage is impressed on the control terminal CT, the signal level comparing circuit of FIG. 8 functions in the same manner as that of FIG. 4.

When a high voltage is impressed on the control terminal CT, then the MOS transistors TR14, TR15, TR16 and TR17 are rendered conductive, and the MOS transistors TR8 and TR12 and consequently MOS transistors TR5 and TR10 are rendered nonconductive. Since the MOS transistors TR5, TR8, TR10 and TR12 are all rendered nonconductive when the control terminal CT is impressed with a high voltage, substantially no current flows from the power supply terminal VD to the ground. In this case, no voltage is impressed on the inverter 20. Therefore, the MOS transistor TR1 is rendered non-conductive, and the MOS transistor TR2 is also rendered nonconductive by an output signal from the NOR gate 24. At this time, substantially no current runs from the input terminal VI to the ground.

When a low voltage is impressed on the control terminal CT as described above, the signal level comparing circuit of FIG. 8 is operated in the normal condition. When a high voltage is impressed on the control terminal CT, the signal level comparing circuit is deactivated. In this case, the power consumption of the signal level comparing circuit is reduced to a minimum level by the action of the MOS transistors TR8, TR12, TR14, TR15 and TR16 and NOR gate 24.

It will be noted that this invention is not limited to the aforementioned embodiments. In the embodiments of FIGS. 4 and 5, the resistor 12 is chosen to have a higher resistivity than the resistor 10. However, the same effect in assured even when the resistors 10 and 12 are chosen to have the same resistance, and the MOS transistor TR2 is made to have a higher ON-resistance than the MOS transistor TR1. Since, in the embodiment of FIG. 4, the inverter 14 is connected to the MOS transistor TR2, when the voltage level of an output signal from the comparator 2 is shifted, the conduction state of the MOS transistor TR2 will be changed after the conduction state of the MOS transistor TR1 is changed. Even when, therefore, the resistors 10 and 12 are made to have the same resistance, the signal level comparing circuit of FIG. 4 can be operated in a stable condition. In the embodiments of FIGS. 4 and 5, n-channel MOS transistors TR1 and TR2 are used. However, these transistors may be replaced by the p-channel MOS transistors. Further, it is possible to omit the inverters 14 and 18 by substituting a p-channel MOS transistor for one of the MOS transistors TR1 and TR2.

What we claim is:

1. A signal level comparing circuit comprising: first and second power supply terminals respectively set at first and second preset potentials; comparing means connected between said first and second power supply terminals to be operated on a power supply voltage between said first and second power supply terminals, and having a first input terminal to be set at a reference potential lying between the first and second preset potentials and a second input terminal; a signal input terminal; first resistive means connected between said signal input terminal and said second input terminal of said comparing means; a first series circuit having first switching means and second resistive means and connected between the second input terminal of said comparing means and said second power supply terminal; and a second series circuit having second switching means and third resistive means and connected between the second input terminal of said comparing means and said second power supply terminal; said first and second switching means being set to opposite conduction states from each other in response to an output signal from said comparing means, and a total resistance of said second resistive means and said first switching means in the ON state being set different from a total resistance of said third resistive means and said second switching means in the ON state.

2. A signal level comparing circuit according to claim 1, wherein said second resistive means is chosen to have a higher resistance than said third resistive means, whereby an output signal from said comparing means is reliably set to one of two signal levels in response to an input signal supplied to said second input terminal.

3. A signal level comparing circuit according to claim 2, wherein said first switching means is formed of an MOS transistor whose current path is connected in series with said second resistive means between the second input terminal of said comparing means and said second power supply terminal and whose conduction state is controlled according to an output signal from said comparing means; and said second switching means is formed of an MOS transistor whose current path is connected in series with said third resistive means between the second input terminal of said comparing means and said second power supply terminal and whose conduction state is controlled according to an inverted signal of an output signal from said comparing means.

4. A signal level comparing circuit according to claim 2, wherein said first switching means is formed of an MOS transistor whose current path is connected in series with said second resistive means between the second input terminal of said comparing means and said second power supply terminal and whose conduction state is controlled according to an inverted signal of an output signal from said comparing means; and said second switching means is formed of an MOS transistor whose current path is connected in series with said third resistive means between the second input terminal of said comparing means and said second power supply terminal and whose conduction state is controlled according to an output signal from said comparing means.

5. A signal level comparing circuit according to claim 1, wherein the second and third resistive means have the same resistance.

6. A signal level comparing circuit according to claim 5, wherein said first switching means is formed of an MOS transistor whose current path is connected in series with said second resistive means between the second input terminal of said comparing means and said second power supply terminal and whose conduction state is controlled according to an output signal from said comparing means; and said second switching means is formed of an MOS transistor whose current path is connected in series with said third resistive means between the second input terminal of said comparing means and said second power supply terminal and whose conduction state is controlled according to an inverted signal of an output signal from said comparing means.

* * * * *